United States Patent
Yamaura et al.

(10) Patent No.: US 9,527,983 B2
(45) Date of Patent: *Dec. 27, 2016

(54) SEALING MATERIAL FOR SOLAR CELL AND CROSSLINKING AID

(71) Applicant: NIPPON KASEI CHEMICAL COMPANY LIMITED, Iwaki-shi, Fukushima-ken (JP)

(72) Inventors: Mabuko Yamaura, Iwaki (JP); Yukio Orikasa, Iwaki (JP); Kazuya Senzaki, Iwaki (JP)

(73) Assignee: NIPPON KASEI CHEMICAL COMPANY LIMITED, Iwaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/782,132

(22) PCT Filed: May 19, 2014

(86) PCT No.: PCT/JP2014/063263
§ 371 (c)(1),
(2) Date: Oct. 2, 2015

(87) PCT Pub. No.: WO2014/189019
PCT Pub. Date: Nov. 27, 2014

(65) Prior Publication Data
US 2016/0068662 A1   Mar. 10, 2016

(30) Foreign Application Priority Data

May 21, 2013  (JP) .................... 2013-106721

(51) Int. Cl.
| | | |
|---|---|---|
| C08K 5/11 | (2006.01) | |
| C08K 5/3492 | (2006.01) | |
| H01L 31/048 | (2014.01) | |
| C08K 5/00 | (2006.01) | |
| C09J 123/08 | (2006.01) | |
| H01L 31/0203 | (2014.01) | |

(52) U.S. Cl.
CPC ......... *C08K 5/34924* (2013.01); *C08K 5/0025* (2013.01); *C08K 5/11* (2013.01); *C09J 123/08* (2013.01); *H01L 31/0203* (2013.01); *H01L 31/0481* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 2011/0071232 A1* | 3/2011 | Jung | .......... | C08F 2/38 522/46 |
| 2012/0285529 A1* | 11/2012 | Kataoka | ......... | C08F 255/02 136/256 |
| 2014/0305682 A1* | 10/2014 | Sato | .......... | C08K 3/00 174/253 |

FOREIGN PATENT DOCUMENTS

| | | |
|---|---|---|
| JP | 60-226589 | 11/1985 |
| JP | 62-148509 | 7/1987 |
| JP | 2011-204880 | 10/2011 |
| JP | 2012-238857 | 12/2012 |
| WO | WO 2011/065157 | * 6/2011 |

OTHER PUBLICATIONS

International Search Report for PCT/JP2014/063263, mailed Jun. 10, 2014, 2 pages.
International Preliminary Report on Patentability issued in PCT/JP2014/063263 dated Nov. 24, 2015.

* cited by examiner

*Primary Examiner* — Robert C Boyle
(74) *Attorney, Agent, or Firm* — Nixon & Vanderhye P.C.

(57) ABSTRACT

The present invention provides a sealing material for a solar cell used in a solar power generation system having a system voltage of 600 V or more. The sealing material is constituted of a heat-crosslinking resin composition comprising an ethylene copolymer, a crosslinking agent and a crosslinking aid that comprises a polyfunctional monomer having 4 or more (meth)acryloyl groups in combination with triallyl isocyanurate.

18 Claims, No Drawings

SEALING MATERIAL FOR SOLAR CELL AND CROSSLINKING AID

This application is the U.S. national phase of International Application No. PCT/JP2014/063263 filed 19 May 2014, which designated the U.S. and claims priority to JP Patent Application No. 2013-106721 filed 21 May 2013, the entire contents of each of which are hereby incorporated by reference.

TECHNICAL FIELD

The present invention relates to a sealing material for a solar cell and a crosslinking aid. More specifically, the present invention relates to a sealing material for a solar cell used in a solar power generation system having a system voltage of 600 V or more and a crosslinking aid used in the sealing material which comprises triallyl isocyanurate (TAIC).

BACKGROUND ART

Conventionally, as a sealing material used for a solar power generation element, there has been proposed a resin composition comprising an ethylene copolymer as a base material and an organic peroxide as a crosslinking agent (Patent Literature 1). TAIC (triallyl isocyanurate) to be used together with the crosslinking agent is a useful crosslinking aid upon obtaining a molded body by curing a crosslinking polymer. In particular, when crosslinking an ethylene-vinyl acetate copolymer with an organic peroxide, TAIC is essentially required as a crosslinking aid, and is capable of providing a sealing material for a solar cell which has high transparency, adhesive properties, heat resistance and flexibility. Actually, a transparent film comprising a triallyl isocyanurate-polymerized crosslinked product of an ethylene-vinyl acetate copolymer as a main component has been proposed for use in applications such as a sealing material for solar cells (Patent Literature 2).

Meanwhile, in recent years, a large-scale power generation system using a solar cell (mega solar system, etc.) has been used, and therefore the system voltage becomes as high as 600 V or more. With this circumstance, there tends to occur such a problem that a sealing material used for the solar cell must be improved in insulation properties (Patent Literatures 3 and 4).

CITATION LIST

Patent Literatures

Patent Literature 1: Japanese Patent Application Laid-Open (KOKAI) No. 60-226589(1985)
Patent Literature 2: Japanese Patent Application Laid-Open (KOKAI) No. 62-148509(1987)
Patent Literature 3: Japanese Patent Application Laid-Open (KOKAI) No. 2011-204880
Patent Literature 4: Japanese Patent Application Laid-Open (KOKAI) No. 2012-238857

SUMMARY OF INVENTION

Technical Problem

The present invention has been made in view of the above circumstances. The object of the present invention is to provide a sealing material for a solar cell used in a solar power generation system having a system voltage of 600 V or more and a crosslinking aid used in the sealing material which comprises triallyl isocyanurate (TAIC).

Solution to Problem

As a result of the present inventors' earnest study to achieve the above object, it has been found that the above object of the present invention can be achieved by using a specific compound in combination with TAIC.

The present invention has been accomplished on the basis of the above findings. In a first aspect of the present invention, there is provided a sealing material for a solar cell used in a solar power generation system having a system voltage of 600 V or more, which is constituted of a heat-crosslinking resin composition comprising an ethylene copolymer, a crosslinking agent and a crosslinking aid that comprises a polyfunctional monomer having 4 or more (meth)acryloyl groups in combination with triallyl isocyanurate.

In a second aspect of the present invention, there is provided a crosslinking aid used in the above sealing material for a solar cell which comprises a polyfunctional monomer having 4 or more (meth)acryloyl groups in combination with triallyl isocyanurate.

Advantageous Effects of Invention

According to the present invention, the above problem can be achieved.

DESCRIPTION OF EMBODIMENT

<Crosslinking Aid>

First, for convenience of explanation, the crosslinking aid according to the present invention is explained. The crosslinking aid according to the present invention comprises a polyfunctional monomer having 4 or more (meth)acryloyl groups in combination with triallyl isocyanurate. A polyfunctional monomer having 3 or less (meth)acryloyl groups may fail to achieve the object of the present invention.

<Polyfunctional Monomer Having 4 or More (meth)acryloyl Groups>

The polyfunctional monomer having 4 or more (meth) acryloyl groups is a compound having 4 or more (meth) acryloyl groups in a molecule thereof. Specific examples of the polyfunctional monomer having 4 or more (meth)acryloyl groups include pentaerythritol tetra(meth)acrylate, ditrimethylolpropane tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, and the like. In addition, an acrylic acid adduct or an acrylic acid ester adduct of these polyfunctional monomers may also be used. Further, an EO-modified product or a PO-modified product of these polyfunctional monomers may also be used. Specific examples of the above adducts and the above modified products of the polyfunctional monomers include a mono-acrylic acid adduct of pentaerythritol tetra(meth)acrylate, a dimer of pentaerythritol triacrylate, an ethoxylated product of pentaerythritol tetraacrylate, an ethoxylated product of dipentaerythritol pentaacrylate, and the like.

In addition, the polyfunctional monomer having 4 or more (meth)acryloyl groups may be a urethane poly(meth)acrylate. The urethane poly(meth)acrylate may be synthesized, for example, from an organic isocyanate and a hydroxyl group-containing (meth)acrylate. The urethane poly(meth)

acrylate having a high molecular weight is preferred. The average molecular weight of the urethane poly(meth)acrylate is not less than 1000, and preferably not less than 1200.

Examples of commercially available products of the polyfunctional monomer having 4 or more (meth)acryloyl groups include "A-DPH", "AD-TMP", "U-4HA", "U-6HA", "U-6LPA", "U-15HA", "UA-122P", "UA-33H", "A-9550", "ATM-35E", "A-DPH-6E", "A-DPH-12E", "M-DPH-6E" and "M-DPH-12E" all produced by Shin-Nakamura Chemical Co., Ltd., "UA-306H", "UA-306T", "UA3061" and "UA510H" all produced by Kyoeisha Chemical Co., Ltd., "KRM8452", "EB1290", "EB5129", "KRM7864" and "EB1290K" all produced by Daicel Cytec Co., Ltd., "Biscoat 802" produced by Osaka Organic Chemical Industry Co., Ltd., "UV7600B", "UV7605B", "UV7610B" and "UV7620EA" all produced by Nippon Synthetic Co., and the like.

These polyfunctional monomers having 4 or more (meth)acryloyl groups may be used in combination of any two or more thereof.

The blending ratio (weight ratio) of the polyfunctional monomer having 4 or more (meth)acryloyl groups and TAIC is usually 1:9 to 9:1.

(Other Crosslinking Aid)

The crosslinking aid according to the present invention may further contain a polyfunctional (meth)acrylate having 3 or less functional groups unless the effects of the present invention are adversely affected by addition thereof. The polyfunctional (meth)acrylate having 3 or less functional groups is a compound having 2 or more (meth)acryloyl groups in a molecule thereof. Specific examples of the polyfunctional (meth)acrylate having 3 or less functional groups include trimethylolpropane tri(meth)acrylate, pentaerythritol tri(meth)acrylate, diethylene glycol di(meth)acrylate, tetraethylene glycol di(meth)acrylate, and the like.

Next, the sealing material for a solar cell according to the present invention is described. The sealing material for a solar cell according to the present invention is constituted of a resin composition comprising an ethylene copolymer as a base material (ethylene copolymer composition).

<Ethylene Copolymer>

The ethylene copolymer is a copolymer of ethylene as a main component and a monomer that is copolymerizable with the ethylene. Examples of the monomer include vinyl esters, unsaturated carboxylic acid esters, unsaturated carboxylic acids and metal salts thereof, unsaturated silicon compounds, α-olefins, and the like. As the copolymerizable monomers, polar monomers are preferred. Specific examples of the ethylene copolymer include ethylene-vinyl ester copolymers such as ethylene-vinyl acetate copolymers, ethylene-unsaturated carboxylic acid ester copolymers such as ethylene-methyl acrylate copolymers and ethylene-isobutyl acrylate-methacrylic acid copolymers, and ionomers thereof. Of these ethylene copolymers, particularly preferred are the ethylene-vinyl acetate copolymers. The vinyl acetate content of the ethylene-vinyl acetate copolymer is 20 to 35% by weight, and preferably 25 to 35% by weight.

The amount of the above crosslinking aid of the present invention compounded in the resin composition (as a total amount of the polyfunctional monomer having 4 or more (meth)acryloyl groups and TAIC) is usually 0.1 to 3.0 parts by weight, and preferably 0.5 to 2.0 parts by weight based on 100 parts by weight of the ethylene copolymer. In addition, when using the other crosslinking aid in combination with the above crosslinking aid, the amount of the other crosslinking aid compounded is usually 0.1 to 3.0 parts by weight, and preferably 0.5 to 2.0 parts by weight based on 100 parts by weight of the ethylene copolymer.

<Crosslinking Agent>

As the crosslinking agent, an organic peroxide may be generally used. The organic peroxide is not particularly limited as long as it is a known organic peroxide to generate peroxy radicals under the vulcanization conditions. Examples of the organic peroxide include di-t-butylperoxide, dicumylperoxide, 2,5-dimethyl-2,5-di(benzoylperoxy)hexane, 2,5-dimethyl-2,5-di(t-butylperoxy)hexane, t-butylperoxy-2-ethylhexyl-monocarbonate, 1,1-bis(t-butylperoxy)-3,5,5-trimethyl cyclohexane, 2,5-dimethylhexane-2,5-dihydroxyperoxide, t-butylcumylperoxide, α,α'-bis(t-butylperoxy)-p-diisopropyl benzene, 2,5-dimethyl-2,5-di(t-butylperoxy)hexyne-3, benzoylperoxide, t-butylperoxy benzene, and the like.

The amount of the crosslinking agent compounded may vary depending on the type of the ethylene copolymer, and is usually 0.6 to 5 parts by weight, and preferably 1 to 2 parts by weight based on 100 parts by weight of the ethylene copolymer. In the case where the crosslinking agent is used in an excessive amount, the crosslinked ethylene copolymer tends to suffer from "bulging".

<Additives>

For example, optional additives such as reinforcing agents, fillers, plasticizers, processing aids, lubricants, pigments, anti-aging agents, coupling agents, ultraviolet absorbers may also be used.

Specific examples of the anti-aging agents include di-t-butyl-P-cresol, pentaerythrityl-tetraoxy[3-(3,5-di-t-butyl-4-hydroxyphenyl)propionate], 2,2'-methylenebis(2-methyl-6-t-butylphenyl), bis(2,2,6,6-tetramethyl-4-piperadyl)sebacate, N,N'-hexane-1,6-diyl bis[3-(3,5-di-tert-butyl-4-hydroxyphenyl)propionamide], bis(2,2,6,6-tetramethyl-4-piperadyl)sebacate, hydroquinone monomethyl ether, methylhydroquinone, and the like.

Specific examples of the coupling agents include γ-chloropropyl trimethoxysilane, vinyl triethoxysilane, vinyl-tris-(β-methoxyethoxy)silane, γ-methacryloxypropyl trimethoxysilane, β-(3,4-ethoxycyclohexyl)ethyl trimethoxysilane, γ-glycidoxypropyl trimethoxysilane, γ-mercaptopropyl trimethoxysilane, γ-aminopropyl trimethoxysilane, N-β-(aminoethyl)-γ-aminopropyl trimethoxysilane, and the like.

Specific examples of the ultraviolet absorbers include 2-hydroxy-4-n-octyloxy benzophenone, 2,2-hydroxy 6-4,4-dimethoxy benzophenone, 2-(2'-hydroxy-5-methylphenyl) benzotriazole, p-t-butylphenyl salicylate, and the like.

The amount of the above additives added is usually not more than 10 parts by weight, and preferably not more than 5 parts by weight based on 100 parts by weight of the ethylene copolymer.

<Crosslinking of Ethylene Copolymer Composition>

Heat-crosslinking may be conducted by using a molding machine, for example, an injection molding machine, a compression molding machine and the like, and heating at a temperature of 150 to 200° C. for about 2 to 30 min to obtain a molded body. If necessary, thereafter, the secondary crosslinking may be conducted by heating at a temperature of 150 to 200° C. for 1 to 10 hr.

A solar cell using the sealing material for a solar cell according to the present invention is a solar cell used in a large-scale power generation system having a system voltage of 600 V or more (mega solar system, etc.).

EXAMPLES

Next, the present invention is described in more detail below by the following Examples. However, these Examples are only illustrative and not intended to limit the present invention thereto.

Comparative Examples 1 to 3 and Examples 1 to 6

Respective components shown in Table 1 below were kneaded with an open roll mill. Respective compounds shown in Table 2 were used as a crosslinking aid 2 in each Example or Comparative Example. The resulting composition was subjected to hot press crosslinking (primary crosslinking) at 150° C. to obtain a sheet having a thickness of 1 mm. A volume resistivity value of the sheet was measured by the method shown in Table 3. The measurement results are shown in Table 4.

TABLE 1

<Basic formulation>

| Components | Part(s) by weight |
|---|---|
| EVA: VA content 32% (produced by Tosoh Corp.) | 100 |
| Organic peroxide: "PERBUTYL E" (produced by NOF Corp.) | 1.3 |
| Crosslinking aid 1: TAIC (produced by Nippon Kasei Chemical Co., Ltd.) | 0.5 |
| Crosslinking aid 2 | 0.5 |
| Silane coupling agent "KBM-503" (produced by Shin-Etsu Chemical Co., Ltd.) | 0.5 |
| Ultraviolet absorber: 2-hydroxy-4-(octyloxy) benzophenone (produced by Wako Pure Chemical Industries, Ltd.) | 0.2 |

TABLE 2

<Crosslinking aid 2>

| | |
|---|---|
| TMPTMA | Trimethylolpropane trimethacrylate |
| TMPTA | Trimethylolpropane triacrylate |
| AD-TMP | Ditrimethylolpropane tetraacrylate (produced by Shin-Nakamura Chemical Co., Ltd.) |
| AD-DPH | Dipentaerythritol hexaacrylate (produced by Shin-Nakamura Chemical Co., Ltd.) |
| VISCOAT 802 | A mixture of tripentaerythritol octaacrylate and tripentaerythritol heptaacrylate (produced by Osaka Organic Chemical Industry Ltd.) |
| EB-1290 | 6-Functional urethane acrylate (produced by Daicel-Cytec Co., Ltd.) |
| KRM8452 | 10-Functional urethane acrylate (produced by Daicel-Cytec Co., Ltd.) |
| U-15HA | 15-Functional urethane acrylate (produced by Shin-Nakamura Chemical Co., Ltd.) |

TABLE 3

<Measuring device and measuring method>

| | |
|---|---|
| Superinsulating meter | SM-8220 (manufactured by HIOKI E.E. Corp.) |

TABLE 3-continued

<Measuring device and measuring method>

| | |
|---|---|
| Electrode for flat samples | SME-8310 (manufactured by HIOKI E.E. Corp.) |
| Measuring method | A sample film was charged at applied voltage of 1000 V (AV.) for one min under environmental conditions of 20° C. and 30% RH. After that, power supply was stopped, and a volume resistance value of the sample film was measured after 30 sec from the stop of power supply. A volume resistivity of the sample film was calculated from the thus measured value. |

TABLE 4

| | Crosslinking aid 2 | Number of functional groups of crosslinking aid 2 | Volume resistivity $\Omega \cdot cm$ |
|---|---|---|---|
| Comparative Example 1 | TAIC | 3 | 1.29E+15 |
| Comparative Example 2 | TMPTMA | 3 | 1.56E+15 |
| Comparative Example 3 | TMPTA | 3 | 3.64E+15 |
| Example 1 | AD-TMP | 4 | 6.87E+15 |
| Example 2 | A-DPH | 6 | 6.87E+15 |
| Example 3 | VISCOAT 802 | 7-8 | 7.48E+15 |
| Example 4 | EB-1290 | 6 | 7.48E+15 |
| Example 5 | KRM 8452 | 10 | 6.90E+15 |
| Example 6 | U-15HA | 15 | 5.33E+15 |

Examples 7 to 10

Four kinds of urethane poly(meth)acrylates having different number-average molecular weights from each other were synthesized using isophorone diisocyanate as an organic isocyanate and pentaerythritol triacrylate as a hydroxyl group-containing (meth) acrylate. The number-average molecular weight of each of the resulting urethane poly(meth)acrylates was measured by GPC. The measurement conditions are shown in Table 5.

An EVA sheet was produced using each of the above urethane poly(meth)acrylates as the crosslinking aid 2 in the same manner as in the above Examples, and the volume resistivity of the resulting EVA sheet was measured. The results were shown in Table 6. The measurement of the volume resistivity of the EVA sheet was conducted by the same method as used in the above Examples (except that it was conducted at a temperature of 25° C. and a humidity of 21%).

TABLE 5

<GPC measurement conditions>

| | |
|---|---|
| Apparatus name | "GPC-8020" manufactured by Tosoh Corporation |
| Columns | "TSKgel SUPER HM-N" × 2 + "HZ1000" × 1 (column 2: semi-micro) |
| Carrier | THF |
| Flow rate | 0.6 mL/min |
| Concentration | about 0.4% |

TABLE 5-continued

| <GPC measurement conditions> | |
|---|---|
| Detector | RI |
| Column temperature | 40° C. |
| Calibration curve | PS |

TABLE 6

| | Number-average molecular weight of crosslinking aid 2 | Number of functional groups of crosslinking aid 2 | Volume resistivity Ω · cm |
|---|---|---|---|
| Example 7 | 1477 | 6 | 2.23E+16 |
| Example 8 | 1201 | 6 | 9.56E+15 |
| Example 9 | 1134 | 6 | 7.01E+15 |
| Example 10 | 1053 | 6 | 4.30E+15 |

The invention claimed is:

1. A sealing material for a solar cell used in a solar power generation system having a system voltage of 600 V or more, the sealing material being constituted of a heat-crosslinking resin composition comprising an ethylene copolymer, a crosslinking agent and a crosslinking aid that comprises a urethane poly(meth)acrylate having 4 or more (meth)acryloyl groups in combination with triallyl isocyanurate, wherein the urethane poly(meth)acrylate has an average molecular weight of not less than 1000.

2. A solar cell comprising the sealing material according to claim 1.

3. The sealing material according to claim 1, wherein the urethane poly(meth)acrylate is synthesized from an organic isocyanate and a hydroxyl group-containing (meth)acrylate.

4. The sealing material according to claim 1, wherein the urethane poly(meth)acrylate has an average molecular weight of not less than 1200.

5. The sealing material according to claim 1, wherein the sealing material has a weight ratio of the urethane poly (meth)acrylate to the triallyl isocyanurate between 1:9 and 9:1.

6. The sealing material according to claim 1, wherein the ethylene copolymer comprises an ethylene-vinyl acetate copolymer.

7. The sealing material according to claim 6, wherein a vinyl acetate content of the ethylene-vinyl acetate copolymer is 20 to 35% by weight.

8. The sealing material according to claim 6, wherein a vinyl acetate content of the ethylene-vinyl acetate copolymer is 25 to 35% by weight.

9. The sealing material according to claim 1, wherein the sealing material comprises the crosslinking aid in an amount of 0.1 to 3.0 parts by weight based on 100 parts by weight of the ethylene copolymer.

10. The sealing material according to claim 1, wherein the sealing material comprises the crosslinking aid in an amount of 0.5 to 2.0 parts by weight based on 100 parts by weight of the ethylene copolymer.

11. The sealing material according to claim 1, wherein the crosslinking agent is an organic peroxide.

12. The sealing material according to claim 1, wherein the sealing material comprises the crosslinking agent in an amount of 0.6 to 5 parts by weight based on 100 parts by weight of the ethylene copolymer.

13. The sealing material according to claim 1, wherein the sealing material comprises the crosslinking agent in an amount of 1 to 2 parts by weight based on 100 parts by weight of the ethylene copolymer.

14. The sealing material according to claim 1 further comprising at least one additive selected from the group consisting of reinforcing agents, fillers, plasticizers, processing aids, lubricants, pigments, anti-aging agents, coupling agents, and ultraviolet absorbers.

15. The sealing material according to claim 14, wherein the sealing material comprises the at least one additive in an amount of not more than 10 parts by weight based on 100 parts by weight of the ethylene copolymer.

16. A method of making a solar cell comprising subjecting the sealing material according to claim 1 to heat-crosslinking to obtain a molded body.

17. The method of making a solar cell according to claim 16, wherein the heat-crosslinking occurs at a temperature of 150 to 200° C. for about 2 to 30 minutes to obtain a molded body.

18. The method of making a solar cell according to claim 17 further comprising subjecting the molded body to a secondary heating at a temperature of 150 to 200° C. for 1 to 10 hours.

* * * * *